(12) United States Patent
Xu (10) Patent No.: US 10,032,808 B2
(45) Date of Patent: Jul. 24, 2018

(54) TFT SUBSTRATE MANUFACTURING METHOD

(71) Applicant: Shenzhen China Star Optoelectronics Technology Co., Ltd., Shenzhen (CN)

(72) Inventor: Xiangyang Xu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 122 days.

(21) Appl. No.: 15/115,911

(22) PCT Filed: Jun. 17, 2016

(86) PCT No.: PCT/CN2016/086130
§ 371 (c)(1),
(2) Date: Aug. 2, 2016

(87) PCT Pub. No.: WO2017/121073
PCT Pub. Date: Jul. 20, 2017

(65) Prior Publication Data
US 2018/0069032 A1    Mar. 8, 2018

(30) Foreign Application Priority Data

Jan. 13, 2016  (CN) .......................... 2016 1 0020660

(51) Int. Cl.
*H01L 21/00*   (2006.01)
*H01L 27/12*   (2006.01)
(Continued)

(52) U.S. Cl.
CPC .... *H01L 27/1262* (2013.01); *G02F 1/136227* (2013.01); *G02F 1/136286* (2013.01);
(Continued)

(58) Field of Classification Search
CPC .............. H01L 27/1262; H01L 27/124; H01L 27/1225; H01L 2021/775; G02F 1/136227; G02F 1/136286
(Continued)

(56) References Cited

U.S. PATENT DOCUMENTS

| | | | | |
|---|---|---|---|---|
| 7,875,475 B2 * | 1/2011 | Suh | ...................... | H01L 27/3246 257/59 |
| 8,030,642 B2 * | 10/2011 | Yang | ...................... | H01L 27/283 257/40 |
| 2015/0187800 A1 * | 7/2015 | Park | ...................... | H01L 27/124 349/43 |

FOREIGN PATENT DOCUMENTS

| | | |
|---|---|---|
| CN | 102629585 A | 8/2012 |
| CN | 202473925 U | 10/2012 |
| CN | 105097829 A | 11/2015 |

* cited by examiner

*Primary Examiner* — Vu A Vu
(74) *Attorney, Agent, or Firm* — Leong C. Lei (57) ABSTRACT

Disclosed is a TFT substrate manufacturing method, which first forms a pixel electrode, a data line, and source/drain terminals on a base plate and then forms a channel protection layer and an oxide semiconductor layer; or alternatively first forming a buffer layer on the base plate to prevent characteristics of a TFT from being affected by direct contact between an oxide semiconductor layer and the base plate, and then forming the oxide semiconductor layer directly after formation of source/drain terminals so as to save one etch stopper layer, thus preventing damages induced in the oxide semiconductor layer by an etching operation of the source/drain terminals; and further, through forming a protective layer that covers a surface of a gate terminal to protect the gate terminal from corrosion at the same time of forming a common electrode, formation of an insulation protective layer can be saved.

13 Claims, 8 Drawing Sheets

(51) Int. Cl.
 *G02F 1/1362* (2006.01)
 *H01L 21/77* (2017.01)
(52) U.S. Cl.
 CPC ........ *H01L 27/124* (2013.01); *H01L 27/1225* (2013.01); *H01L 2021/775* (2013.01)
(58) Field of Classification Search
 USPC ........................................................ 438/151
 See application file for complete search history.

TFT SUBSTRATE MANUFACTURING METHOD

BACKGROUND OF THE INVENTION

1. Field of the Invention

The present invention relates to the field of liquid crystal display technology, and in particular to a thin-film transistor (TFT) substrate manufacturing method.

2. The Related Arts

Liquid crystal displays (LCDs) have widely used in human living and work. A liquid crystal panel of the liquid crystal display is of vital importance for the displaying effect of the liquid crystal display, including view angle, degree of brightness, and color.

Based on the arrangement of liquid crystal molecules after rotation, the liquid crystal displays can be commonly classified as twisted nematic (TN) LCDs, super twisted nematic (STN) LCDs, and double layer super twisted nematic (DSTN) LCDs, which have narrow view angles, in-plane switching (IPS), fringe field switching (FFS), and multi-domain vertical alignment (MVA), which have wide view angles. Among these devices, the main stream of the liquid crystal displays available in the market is the TN mode. However, the TN LCDs has inherent drawbacks in respect of view angles and they cannot suit the needs for wide view angles even a wide view angle compensation film is added. Thus, many of the manufacturers have been devoted themselves in the development of wide view angle technologies, among which IPS is one exhibiting promising advantages.

The IPS technology makes use of spatial thickness and rubbing intensity, in combination with variation of driving achieved with horizontal electrical fields, to make liquid crystal molecules undergo a maximum angle of rotation on a plane in order to expand the view angle. In other words, in the traditional LCDs, liquid crystal molecules are generally switched between vertical and parallel conditions and the MVA and PVA (Patterned Vertical Alignment) technologies change it to switching between vertical and bidirectional inclined conditions, while the IPS technology achieves switching by allowing liquid crystal molecules to undergo horizontal rotation to allow backlighting to pass therethrough, meaning the liquid crystal molecules are always parallel to the screen surface with on the rotation direction of the molecules being different for energized and regular conditions. To adopt such a structure, the IPS technology involves modification of electrodes such that the electrodes are on the same side to form a horizontal electric field so that rotation of liquid crystal in a vertical direction can be avoided thereby helping achieve an expanded view angle. The IPS technology arranges a pixel electrode and a common electrode in strip forms on the same layer. Since liquid crystal located exactly above the electrodes cannot conduct in-plane rotation, an IPS mode panel has relatively low aperture ratio and transmission rate. To improve the aperture ratio of the IPS mode, the FFS display mode is proposed.

If a TFT structure of the IPS or FFS liquid crystal display is structured to comprise an a-Si:H layer as a TFT channel, poor driving issues may occur in high definition and high-speed driving panel. This is due to being impossible to ensure a sufficient charging voltage. Taking a high definition panel as an example, with the increase of the definition, the number of TFTs that must be driven in a specified period of time is increased so that the operation time of an individual TFT is reduced. For a high-speed driving panel, a driving speed of 60 Hz makes it necessary for a TFT to conduct on within a time period of 16 msec, and 8.3 msec for 120 Hz, and 4.2 msec for 240 Hz. Thus, the charging time of the TFT is shortened and the mobility characteristics of the a-Si:H layer cannot make this. Thus, the driving speed of the TFT must be increased and thus high mobility TFT must be used. Compared to a-Si:H, an oxide TFT has relatively high mobility (>10 $cm^2/Vs$), making suitable for driving components of high definition and high-speed driving displays. Based on the above reasons, the oxide TFT technology has been widely used and has been applied to AMOLED and high-end LCD products. The oxide TFT has a relatively large forbidden band width, for example an amorphous metal oxide semiconductor IGZO (indium gallium zinc oxides) having a forbidden band width of around 3.5 eV and thus being not affected for being irradiated with visible light having a wavelength greater than 300 nm, making it one of the top choice materials for flexible displaying. Since etching for the metal oxide semiconductor is generally wet etching and the source/drain metal also uses wet etching, a back channel etch (BCE) structure is generally not suitable for manufacturing operations of the metal oxide semiconductors. Heretofore, an etch stopper based structure is commonly adopted for manufacturing oxide semiconductor TFT.

SUMMARY OF THE INVENTION

An object of the present invention is to provide a thin-film transistor (TFT) substrate, which helps lower resistance of peripheral signal wiring of the TFT substrate, reducing power consumption of control ICs, and improving capability of the TFT substrate for resisting electrostatic discharge.

Another object of the present invention is to provide a manufacturing method of a TFT substrate, which lowers resistance of peripheral signal wiring of the TFT substrate, reduces power consumption of control ICs, and improves capability of the TFT substrate for resisting electrostatic discharge.

To achieve the above objects, the present invention provides a TFT substrate manufacturing method, which comprises the following steps:

(1) providing a base plate, depositing a first transparent conductive layer on the base plate and patterning the first transparent conductive layer to form a pixel electrode;

(2) depositing a first metal layer on the base plate and the pixel electrode and patterning the first metal layer to form source/drain terminals and a data line, wherein the data line comprises a data line terminal formed in a peripheral area of the base plate;

(3) depositing a channel protection layer on the base plate, the pixel electrode, the source/drain terminals, and the data line and forming first vias in the channel protection layer at locations above and corresponding to the source/drain terminals;

(4) depositing an oxide semiconductor layer on the channel protection layer and the source/drain terminals and patterning the oxide semiconductor layer to form an active layer such that the active layer is in contact engagement with the source/drain terminals through the first vias;

(5) depositing a gate insulation layer on the channel protection layer and the active layer;

(6) depositing a second metal layer on the gate insulation layer and patterning the second metal layer to form a gate terminal and a gate scan line, wherein the gate scan line comprises a scan line terminal formed in a peripheral area of the base plate; and forming a second via in the channel protection layer and the gate insulation layer at a location above and corresponding to the data line terminal; and (7) depositing a second transparent conductive layer on the gate insulation layer, the gate terminal, and the gate scan line and patterning the second transparent conductive layer to form a common electrode, a protective layer set on and covering the gate terminal and the gate scan line, and a conductive connection line set in contact engagement with the data line terminal through the second via.

The first transparent conductive layer and the second transparent conductive layer each have a thickness of 100-1000 Å; and the first metal layer and the second metal layer each have a thickness of 1000-6000 Å.

The channel protection layer has a thickness of 1000-4000 Å; the gate insulation layer has a thickness of 2000-4000 Å; and the active layer has a thickness of 200-2000 Å.

The first transparent conductive layer and the second transparent conductive layer are each formed of a material comprising ITO or IZO; and the first metal layer and the second metal layer are each formed of a material comprising Cr, Mo, Al, or Cu.

The channel protection layer is formed of a material comprising silicon oxide; the gate insulation layer is formed of a material comprising silicon oxide, silicon nitride or a combination thereof; and the active layer is formed of a material comprising ZnO, InZnO, ZnSnO, GaInZnO, or ZrInZnO.

The present invention also provides a TFT substrate manufacturing method, which comprises the following steps:

(1) providing a base plate and depositing a buffer layer on the base plate;

(2) depositing a first transparent conductive layer on the buffer layer and patterning the first transparent conductive layer to form a pixel electrode;

(3) depositing a first metal layer on the buffer layer and the pixel electrode and patterning the first metal layer to form source/drain terminals and a data line, wherein the data line comprises a data line terminal formed in a peripheral area of the base plate;

(4) depositing an oxide semiconductor layer on the buffer layer, the pixel electrode, the source/drain terminals, and the data line and patterning the oxide semiconductor layer to form an active layer such that the active layer is in contact engagement with the source/drain terminals;

(5) depositing a gate insulation layer on the buffer layer, the pixel electrode, the source/drain terminals, the data line, and the active layer;

(6) depositing a second metal layer on the gate insulation layer and patterning the second metal layer to form a gate terminal and a gate scan line, wherein the gate scan line comprises a scan line terminal formed in a peripheral area of the base plate; and forming a via in the gate insulation layer at a location above and corresponding to the data line terminal; and (7) depositing a second transparent conductive layer on the gate insulation layer, the gate terminal, and the gate scan line and patterning the second transparent conductive layer to form a common electrode, a protective layer set on and covering the gate terminal and the gate scan line, and a conductive connection line set in contact engagement with the data line terminal through the via.

The first transparent conductive layer and the second transparent conductive layer each have a thickness of 100-1000 Å; and the first metal layer and the second metal layer each have a thickness of 1000-6000 Å.

The buffer layer has a thickness of 1000-2000 Å; the gate insulation layer has a thickness of 2000-4000 Å; and the active layer has a thickness of 200-2000 Å

The first transparent conductive layer and the second transparent conductive layer are each formed of a material comprising ITO or IZO; and the first metal layer and the second metal layer are each formed of a material comprising Cr, Mo, Al, or Cu.

The buffer layer is formed of a material comprising silicon oxide; the gate insulation layer is formed of a material comprising silicon oxide, silicon nitride or a combination thereof; and the active layer is formed of a material comprising ZnO, InZnO, ZnSnO, GaInZnO, or ZrInZnO.

The present invention further provides a TFT substrate manufacturing method, which comprises the following steps:

(1) providing a base plate, depositing a first transparent conductive layer on the base plate and patterning the first transparent conductive layer to form a pixel electrode;

(2) depositing a first metal layer on the base plate and the pixel electrode and patterning the first metal layer to form source/drain terminals and a data line, wherein the data line comprises a data line terminal formed in a peripheral area of the base plate;

(3) depositing a channel protection layer on the base plate, the pixel electrode, the source/drain terminals, and the data line and forming first vias in the channel protection layer at locations above and corresponding to the source/drain terminals;

(4) depositing an oxide semiconductor layer on the channel protection layer and the source/drain terminals and patterning the oxide semiconductor layer to form an active layer such that the active layer is in contact engagement with the source/drain terminals through the first vias;

(5) depositing a gate insulation layer on the channel protection layer and the active layer;

(6) depositing a second metal layer on the gate insulation layer and patterning the second metal layer to form a gate terminal and a gate scan line, wherein the gate scan line comprises a scan line terminal formed in a peripheral area of the base plate; and forming a second via in the channel protection layer and the gate insulation layer at a location above and corresponding to the data line terminal; and (7) depositing a second transparent conductive layer on the gate insulation layer, the gate terminal, and the gate scan line and patterning the second transparent conductive layer to form a common electrode, a protective layer set on and covering the gate terminal and the gate scan line, and a conductive connection line set in contact engagement with the data line terminal through the second via;

wherein the first transparent conductive layer and the second transparent conductive layer each have a thickness of 100-1000 Å and the first metal layer and the second metal layer each have a thickness of 1000-6000 Å; and wherein the channel protection layer has a thickness of 1000-4000 Å; the gate insulation layer has a thickness of 2000-4000 Å; and the active layer has a thickness of 200-2000 Å.

The efficacy of the present invention is that the present invention provides a TFT substrate manufacturing method, which first forms a pixel electrode, a data line, and source/drain terminals on the base plate and then forms a channel protection layer and an oxide semiconductor layer; or alternatively first forming a buffer layer on a base plate to prevent characteristics of a TFT from being affected by direct contact between an oxide semiconductor layer and the base plate, and then forming the oxide semiconductor layer directly after formation of source/drain terminals so as to save one etch stopper layer, thus preventing damages induced in the oxide semiconductor layer by an etching operation of the source/drain terminals; and further, through forming a protective layer that covers a surface of a gate terminal to protect the gate terminal from corrosion at the same time of forming a common electrode, formation of an insulation protective layer can be saved so as to greatly simplify the manufacturing process and improve reliability of a TFT substrate.

BRIEF DESCRIPTION OF THE DRAWINGS

The features and technical contents of the present invention will be better understood by referring to the following detailed description and drawings the present invention. However, the drawings are provided for the purpose of reference and illustration and are not intended to limit the scope of the present invention. In the drawing.

DETAILED DESCRIPTION OF THE PREFERRED EMBODIMENTS

To further expound the technical solution adopted in the present invention and the advantages thereof, a detailed description is given to a preferred embodiment of the present invention with reference to the attached drawings.

Figure 1:
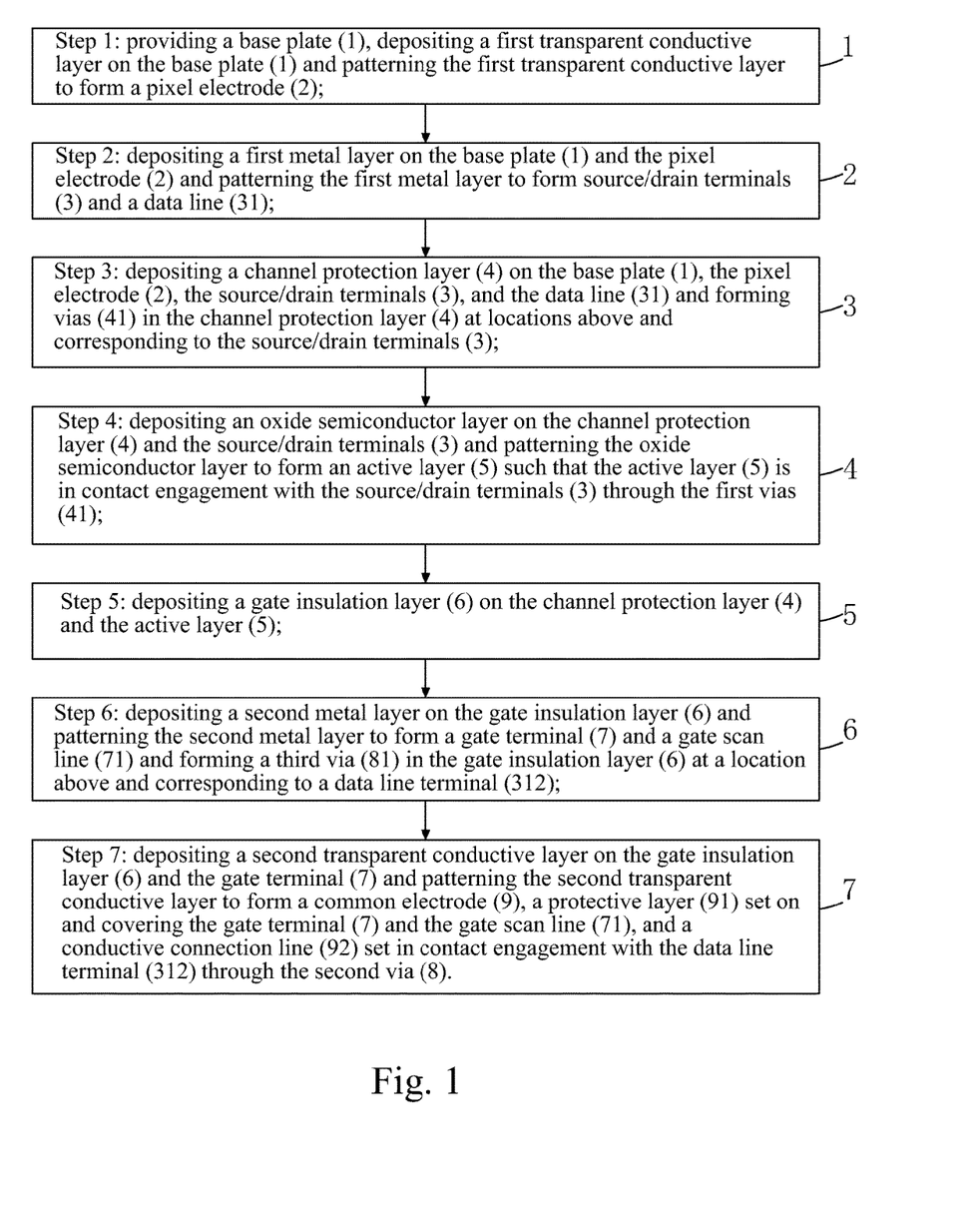
FIG. 1 is a flow chart illustrating a TFT substrate manufacturing method according to the present invention
Figure 2:
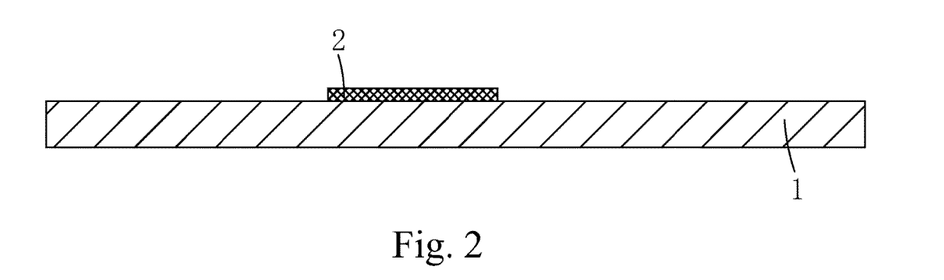
FIG. 2 is a schematic top plan view illustrating step 1 of the TFT substrate manufacturing method according to the present invention.

Referring to FIG. 1, firstly, the present invention provides a thin-film transistor (TFT) substrate manufacturing method, which comprises the following steps:

Step 1: as shown in FIG. 2, providing a base plate 1, depositing a first transparent conductive layer on the base plate 1 and patterning the first transparent conductive layer to form a pixel electrode 2.

Specifically, the base plate 1 comprises a glass plate.

Specifically, the first transparent conductive layer has a thickness of 100-1000 Å.

Specifically, the first transparent conductive layer is formed of a material comprising ITO (indium tin oxide) or IZO (indium zinc oxide).

Figure 3:
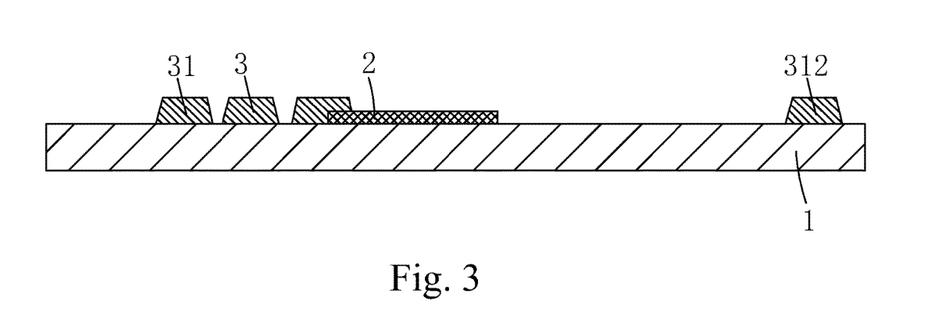
FIG. 3 is a schematic top plan view illustrating step 2 of the TFT substrate manufacturing method according to the present invention.

Step 2: as shown in FIG. 3, depositing a first metal layer on the base plate 1 and the pixel electrode 2 and patterning the first metal layer to form source/drain terminals 3 and a data line 31, wherein the data line 31 comprises a data line terminal 312 formed in a peripheral area of the base plate 1.

Specifically, the first metal layer has a thickness of 1000-6000 Å.

Specifically, the first metal layer is formed of a material comprising Cr (chromium), Mo (molybdenum), Al (aluminum), or Cu (copper).

Figure 4:
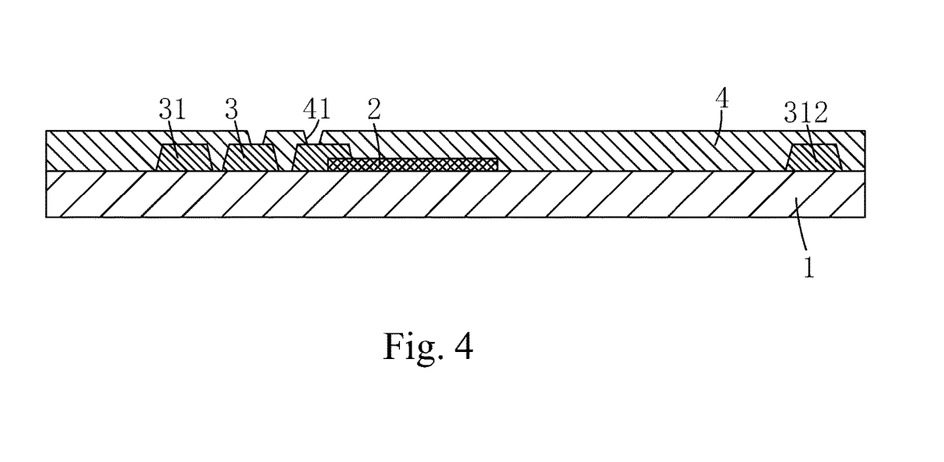
FIG. 4 is a schematic top plan view illustrating step 3 of the TFT substrate manufacturing method according to the present invention.

Step 3: as shown in FIG. 4, depositing a channel protection layer 4 on the base plate 1, the pixel electrode 2, the source/drain terminals 3, and the data line 31 and forming first vias 41 in the channel protection layer 4 at locations above and corresponding to the source/drain terminals 3.

Specifically, the channel protection layer 4 has a thickness of 1000-4000 Å.

Specifically, the channel protection layer 4 is formed of a material comprising silicon oxide.

Figure 5:
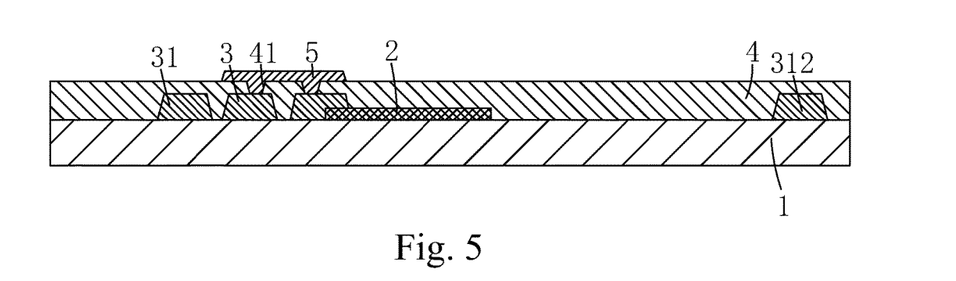
FIG. 5 is a schematic top plan view illustrating step 4 of the TFT substrate manufacturing method according to the present invention.

Step 4: as shown in FIG. 5, depositing an oxide semiconductor layer on the channel protection layer 4 and the source/drain terminals 3 and patterning the oxide semiconductor layer to form an active layer 5 such that the active layer 5 is in contact engagement with the source/drain terminals 3 through the first vias 41. The present invention adopts a process that first forms the pixel electrode, the data line and the source/drain terminals on the base plate and then forms the channel protection layer and the oxide semiconductor layer, so that it is possible to avoid damages induced in the oxide semiconductor layer during etching operations applied in forming the pixel electrode and the source/drain terminals.

Specifically, the active layer 5 has a thickness of 200-2000 Å.

Specifically, the active layer 5 is formed of a material comprising ZnO, InZnO, ZnSnO, GaInZnO, or ZrInZnO.

Figure 6:
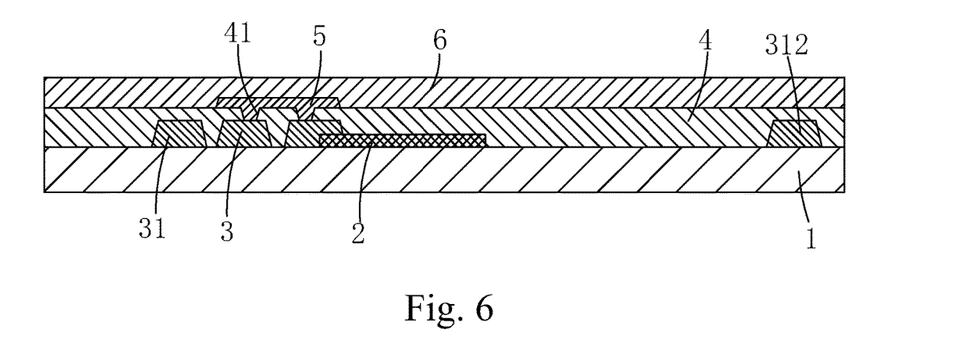
FIG. 6 is a schematic top plan view illustrating step 5 of the TFT substrate manufacturing method according to the present invention.

Step 5: as shown in FIG. 6, depositing a gate insulation layer 6 on the channel protection layer 4 and the active layer 5.

Specifically, the gate insulation layer 6 has a thickness of 2000-4000 Å.

Specifically, the gate insulation layer 6 is formed of a material comprising silicon oxide, silicon nitride or a combination thereof.

Figure 7:
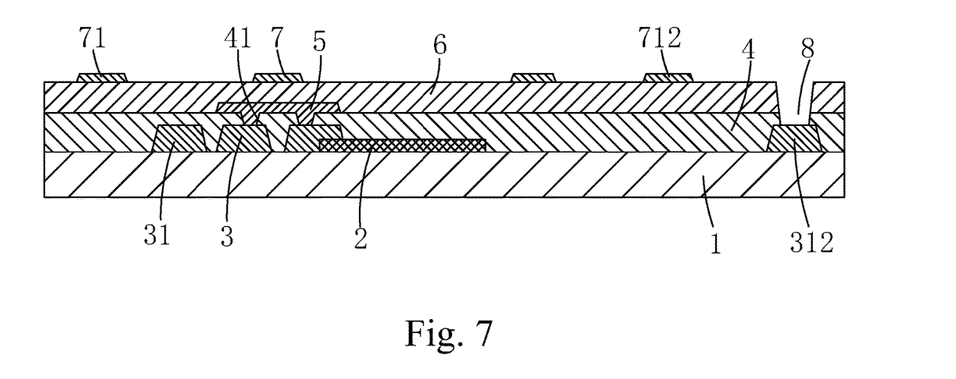
FIG. 7 is a schematic top plan view illustrating step 6 of the TFT substrate manufacturing method according to the present invention.

Step 6: as shown in FIG. 7, depositing a second metal layer on the gate insulation layer 6 and patterning the second metal layer to form a gate terminal 7 and a gate scan line 71, wherein the gate scan line 71 comprises a scan line terminal 712 formed in a peripheral area of the base plate 1; and forming a second via 8 in the channel protection layer 4 and the gate insulation layer 6 at a location above and corresponding to the data line terminal 312.

Specifically, the second metal layer has a thickness of 1000-6000 Å.

Specifically, the second metal layer is formed of a material comprising Cr, Mo, Al, or Cu.

Figure 8:
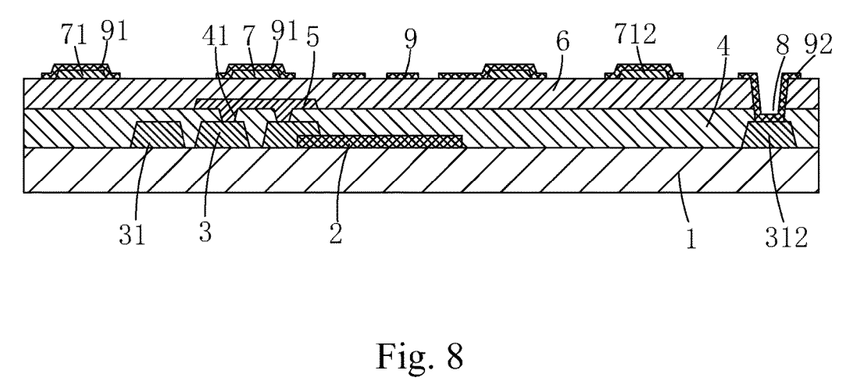
FIG. 8 is a schematic top plan view illustrating step 7 of the TFT substrate manufacturing method according to the present invention.

Step 7: as shown in FIG. 8, depositing a second transparent conductive layer on the gate insulation layer 6, the gate terminal 7, and the gate scan line 71 and patterning the second transparent conductive layer to form a common electrode 9, a protective layer 91 set on and covering the gate terminal 7 and the gate scan line 71, and a conductive connection line 92 set in contact engagement with the data line terminal 312 through the second via 8. Through forming the protective layer that is set on and covers a surface of the gate terminal to protect the gate terminal against corrosion at the same time of forming the common electrode, it is possible to save the use of one insulation protective layer. Specifically, the conductive connection line 92 provides connection between data line 31 and an integrated circuit (IC) chip.

Specifically, the second transparent conductive layer has a thickness of 100-1000 Å.

Specifically, the second transparent conductive layer is formed of a material comprising ITO or IZO.

Figure 9:
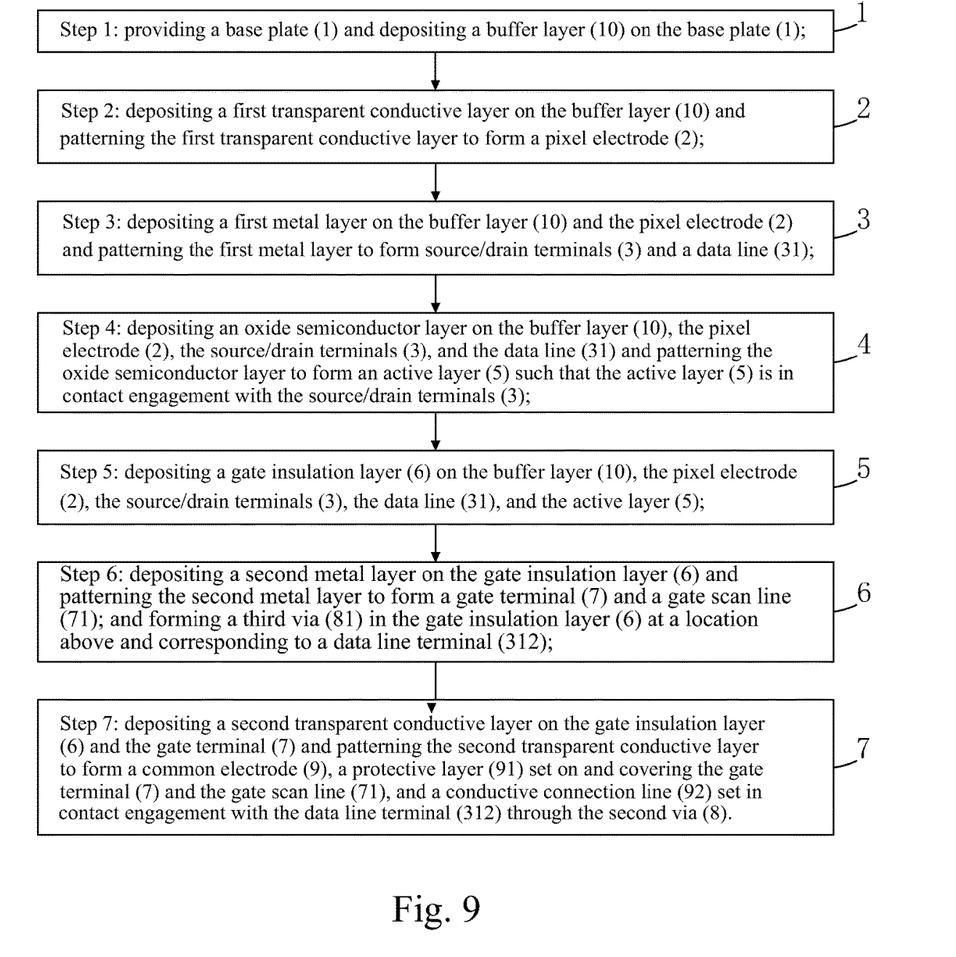
FIG. 9 is a flow chart illustrating another TFT substrate manufacturing method according to the present invention
Figure 10:
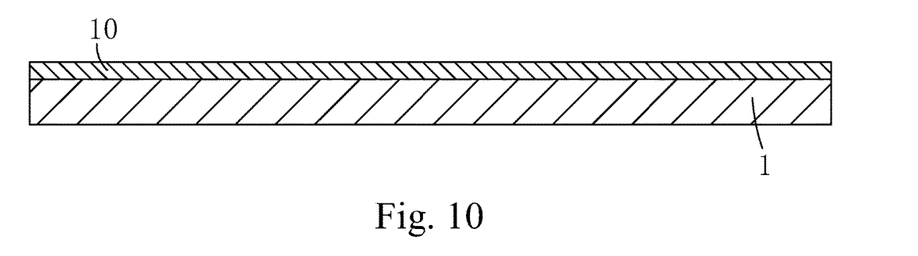
FIG. 10 is a schematic top plan view illustrating step 1 of said another TFT substrate manufacturing method according to the present invention.

Referring to FIG. 9, the present invention also provides another TFT substrate manufacturing method, which comprises the following steps:

Step 1: as shown in FIG. 10, providing a base plate 1 and depositing a buffer layer 10 on the base plate 1. The buffer layer 10 helps prevent direct contact of the oxide semiconductor layer with the base plate 1, which might affects the characteristics of a TFT.

Specifically, the base plate 1 comprises a glass plate.

Specifically, the buffer layer 10 has a thickness of 1000-2000 Å.

Specifically, the buffer layer 10 is formed of a material comprising silicon oxide.

Figure 11:
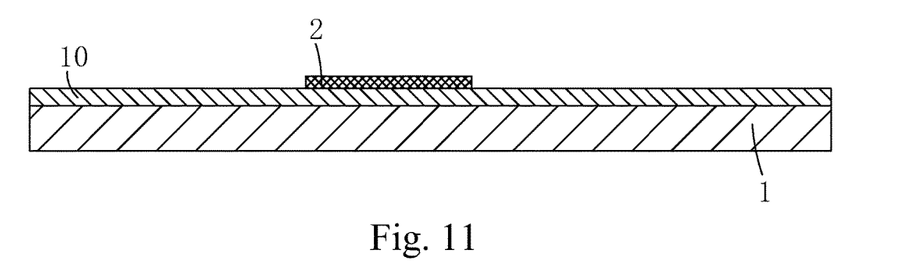
FIG. 11 is a schematic top plan view illustrating step 2 of said another TFT substrate manufacturing method according to the present invention.

Step 2: as shown in FIG. 11, depositing a first transparent conductive layer on the buffer layer 10 and patterning the first transparent conductive layer to form a pixel electrode 2.

Specifically, the first transparent conductive layer has a thickness of 100-1000 Å.

Specifically, the first transparent conductive layer is formed of a material comprising ITO or IZO.

Figure 12:
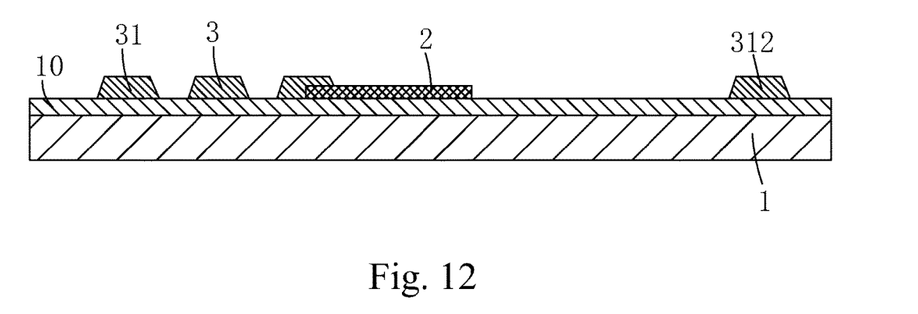
FIG. 12 is a schematic top plan view illustrating step 3 of the said another TFT substrate manufacturing method according to the present invention.

Step 3: as shown in FIG. 12, depositing a first metal layer on the buffer layer 10 and the pixel electrode 2 and patterning the first metal layer to form source/drain terminals 3 and a data line 31, wherein the data line 31 comprises a data line terminal 312 formed in a peripheral area of the base plate 1.

Specifically, the first metal layer has a thickness of 1000-6000 Å.

Specifically, the first metal layer is formed of a material comprising Cr, Mo, Al, or Cu.

Figure 13:
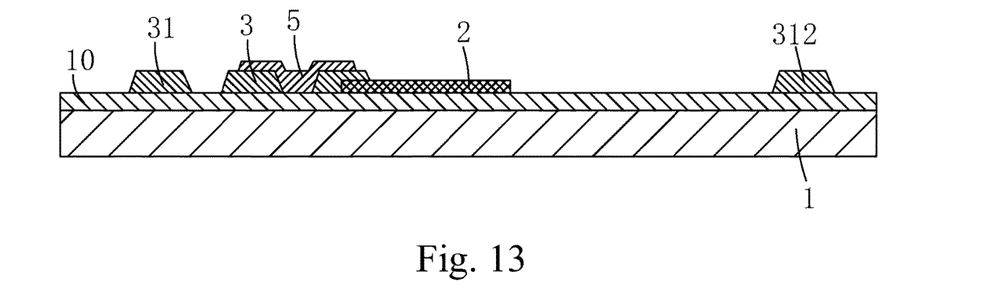
FIG. 13 is a schematic top plan view illustrating step 4 of said another TFT substrate manufacturing method according to the present invention.

Step 4: as shown in FIG. 13, depositing an oxide semiconductor layer on the buffer layer 10, the pixel electrode 2, the source/drain terminals 3, and the data line 31 and patterning the oxide semiconductor layer to form an active layer 5 such that the active layer 5 is in contact engagement with the source/drain terminals 3, whereby one etch stopper layer can be saved and damage induced in the oxide semiconductor layer by an etching operation applied to form the source/drain terminals can be avoided.

Specifically, the active layer 5 has a thickness of 200-2000 Å.

Specifically, the active layer 5 is formed of a material comprising ZnO, InZnO, ZnSnO, GaInZnO, or ZrInZnO.

Figure 14:
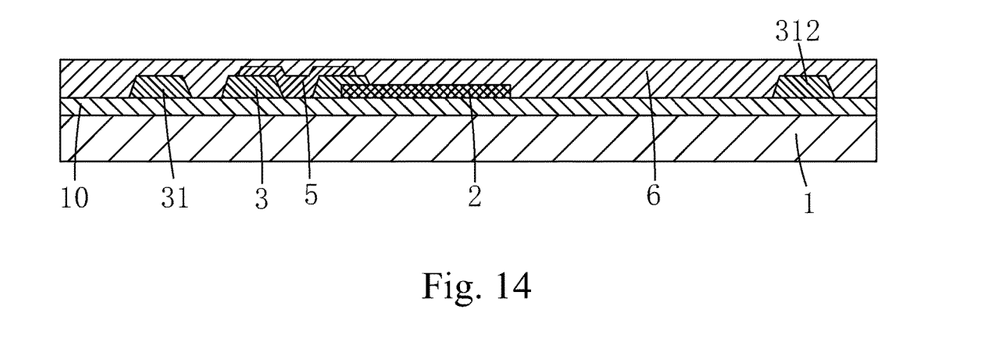
FIG. 14 is a schematic top plan view illustrating step 5 of said another TFT substrate manufacturing method according to the present invention.

Step 5: as shown in FIG. 14 depositing a gate insulation layer 6 on the buffer layer 10, the pixel electrode 2, the source/drain terminals 3, the data line 31, and the active layer 5.

Specifically, the gate insulation layer 6 has a thickness of 2000-4000 Å.

Specifically, the gate insulation layer 6 is formed of a material comprising silicon oxide, silicon nitride or a combination thereof.

Figure 15:
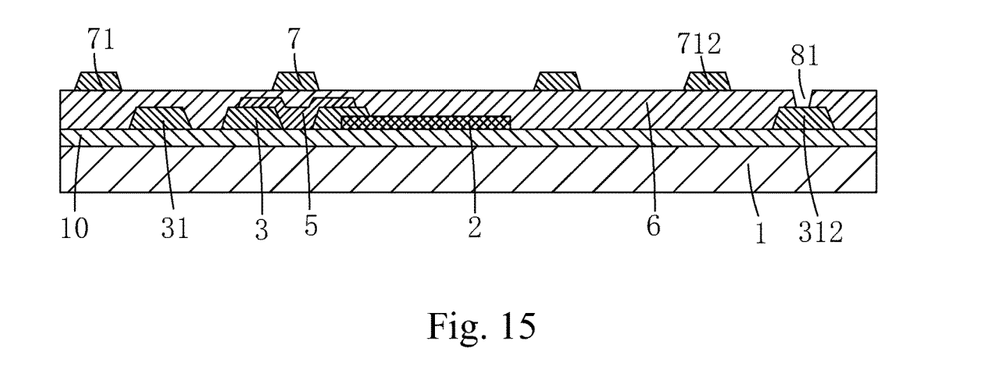
FIG. 15 is a schematic top plan view illustrating step 6 of said another TFT substrate manufacturing method according to the present invention.

Step 6: as shown in FIG. 15, depositing a second metal layer on the gate insulation layer 6 and patterning the second metal layer to form a gate terminal 7 and a gate scan line 71, wherein the gate scan line 71 comprises a scan line terminal 712 formed in a peripheral area of the base plate 1; and forming a third via 81 in the gate insulation layer 6 at a location above and corresponding to the data line terminal 312.

Specifically, the second metal layer has a thickness of 1000-6000 Å.

Specifically, the second metal layer is formed of a material comprising Cr, Mo, Al, or Cu.

Figure 16:
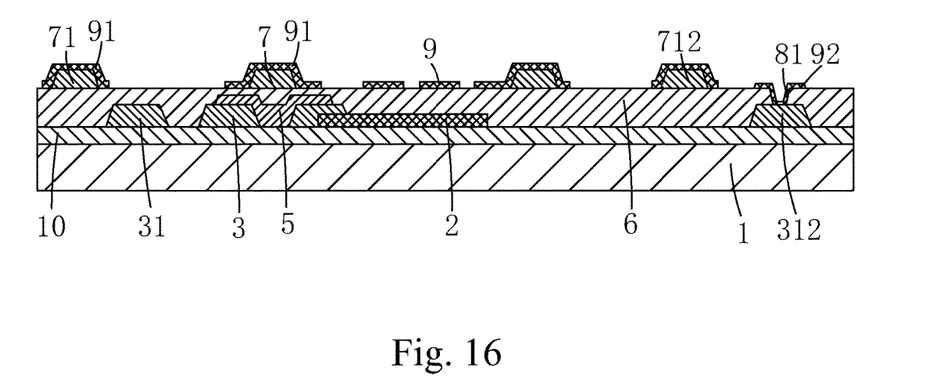
FIG. 16 is a schematic top plan view illustrating step 7 of said another TFT substrate manufacturing method according to the present invention.

Step 7: as shown in FIG. 16, depositing a second transparent conductive layer on the gate insulation layer 6, the gate terminal 7, and the gate scan line 71 and patterning the second transparent conductive layer to form a common electrode 9, a protective layer 91 set on and covering the gate terminal 7 and the gate scan line 71, and a conductive connection line 92 set in contact engagement with the data line terminal 312 through the third via 81. Through forming the protective layer that is set on and covers a surface of the gate terminal to protect the gate terminal against corrosion at the same time of forming the common electrode, it is possible to save the use of one insulation protective layer. Specifically, the conductive connection line 92 provides connection between data line 31 and an integrated circuit (IC) chip.

Specifically, the second transparent conductive layer has a thickness of 100-1000 Å.

Specifically, the second transparent conductive layer is formed of a material comprising ITO or IZO.

In summary, the present invention provides a TFT substrate manufacturing method, which first forms a pixel electrode, a data line, and source/drain terminals on the base plate and then forms a channel protection layer and an oxide semiconductor layer; or alternatively first forming a buffer layer on a base plate to prevent characteristics of a TFT from being affected by direct contact between an oxide semiconductor layer and the base plate, and then forming the oxide semiconductor layer directly after formation of source/drain terminals so as to save one etch stopper layer, thus preventing damages induced in the oxide semiconductor layer by an etching operation of the source/drain terminals; and further, through forming a protective layer that covers a surface of a gate terminal to protect the gate terminal from corrosion at the same time of forming a common electrode, formation of an insulation protective layer can be saved so as to greatly simplify the manufacturing process and improve reliability of a TFT substrate.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A thin-film transistor (TFT) substrate manufacturing method, comprising the following steps:
   (1) providing a base plate, depositing a first transparent conductive layer on the base plate and patterning the first transparent conductive layer to form a pixel electrode;
   (2) depositing a first metal layer on the base plate and the pixel electrode and patterning the first metal layer to form source/drain terminals and a data line, wherein the data line comprises a data line terminal formed in a peripheral area of the base plate;
   (3) depositing a channel protection layer on the base plate, the pixel electrode, the source/drain terminals, and the data line and forming first vias in the channel protection layer at locations above and corresponding to the source/drain terminals;
   (4) depositing an oxide semiconductor layer on the channel protection layer and the source/drain terminals and patterning the oxide semiconductor layer to form an active layer such that the active layer is in contact engagement with the source/drain terminals through the first vias;
   (5) depositing a gate insulation layer on the channel protection layer and the active layer;
   (6) depositing a second metal layer on the gate insulation layer and patterning the second metal layer to form a gate terminal and a gate scan line, wherein the gate scan line comprises a scan line terminal formed in a peripheral area of the base plate; and forming a second via in the channel protection layer and the gate insulation layer at a location above and corresponding to the data line terminal; and
   (7) depositing a second transparent conductive layer on the gate insulation layer, the gate terminal, and the gate scan line and patterning the second transparent conductive layer to form a common electrode, a protective layer set on and covering the gate terminal and the gate scan line, and a conductive connection line set in contact engagement with the data line terminal through the second via.

2. The TFT substrate manufacturing method as claimed in claim 1, wherein the first transparent conductive layer and the second transparent conductive layer each have a thickness of 100-1000 Å; and the first metal layer and the second metal layer each have a thickness of 1000-6000 Å.

3. The TFT substrate manufacturing method as claimed in claim 1, wherein the channel protection layer has a thickness of 1000-4000 Å; the gate insulation layer has a thickness of 2000-4000 Å; and the active layer has a thickness of 200-2000 Å.

4. The TFT substrate manufacturing method as claimed in claim 1, wherein the first transparent conductive layer and the second transparent conductive layer are each formed of a material comprising ITO or IZO; and the first metal layer and the second metal layer are each formed of a material comprising Cr, Mo, Al, or Cu.

5. The TFT substrate manufacturing method as claimed in claim 1, wherein the channel protection layer is formed of a material comprising silicon oxide; the gate insulation layer is formed of a material comprising silicon oxide, silicon nitride or a combination thereof; and the active layer is formed of a material comprising ZnO, InZnO, ZnSnO, GaInZnO, or ZrInZnO.

6. A thin-film transistor (TFT) substrate manufacturing method, comprising the following steps:
   (1) providing a base plate and depositing a buffer layer on the base plate;
   (2) depositing a first transparent conductive layer on the buffer layer and patterning the first transparent conductive layer to form a pixel electrode;
   (3) depositing a first metal layer on the buffer layer and the pixel electrode and patterning the first metal layer to form source/drain terminals and a data line, wherein the data line comprises a data line terminal formed in a peripheral area of the base plate;
   (4) depositing an oxide semiconductor layer on the buffer layer, the pixel electrode, the source/drain terminals, and the data line and patterning the oxide semiconductor layer to form an active layer such that the active layer is in contact engagement with the source/drain terminals;
   (5) depositing a gate insulation layer on the buffer layer, the pixel electrode, the source/drain terminals, the data line, and the active layer;
   (6) depositing a second metal layer on the gate insulation layer and patterning the second metal layer to form a gate terminal and a gate scan line, wherein the gate scan line comprises a scan line terminal formed in a peripheral area of the base plate; and forming a via in the gate insulation layer at a location above and corresponding to the data line terminal; and
   (7) depositing a second transparent conductive layer on the gate insulation layer, the gate terminal, and the gate scan line and patterning the second transparent conductive layer to form a common electrode, a protective layer set on and covering the gate terminal and the gate scan line, and a conductive connection line set in contact engagement with the data line terminal through the via.

7. The TFT substrate manufacturing method as claimed in claim 6, wherein the first transparent conductive layer and the second transparent conductive layer each have a thickness of 100-1000 Å; and the first metal layer and the second metal layer each have a thickness of 1000-6000 Å.

8. The TFT substrate manufacturing method as claimed in claim 6, wherein the buffer layer has a thickness of 1000-2000 Å; the gate insulation layer has a thickness of 2000-4000 Å; and the active layer has a thickness of 200-2000 Å.

9. The TFT substrate manufacturing method as claimed in claim 6, wherein the first transparent conductive layer and the second transparent conductive layer are each formed of a material comprising ITO or IZO; and the first metal layer and the second metal layer are each formed of a material comprising Cr, Mo, Al, or Cu.

10. The TFT substrate manufacturing method as claimed in claim 6, wherein the buffer layer is formed of a material comprising silicon oxide; the gate insulation layer is formed of a material comprising silicon oxide, silicon nitride or a combination thereof; and the active layer is formed of a material comprising ZnO, InZnO, ZnSnO, GaInZnO, or ZrInZnO.

11. A thin-film transistor (TFT) substrate manufacturing method, comprising the following steps:
   (1) providing a base plate, depositing a first transparent conductive layer on the base plate and patterning the first transparent conductive layer to form a pixel electrode;
   (2) depositing a first metal layer on the base plate and the pixel electrode and patterning the first metal layer to form source/drain terminals and a data line, wherein the data line comprises a data line terminal formed in a peripheral area of the base plate;

(3) depositing a channel protection layer on the base plate, the pixel electrode, the source/drain terminals, and the data line and forming first vias in the channel protection layer at locations above and corresponding to the source/drain terminals;

(4) depositing an oxide semiconductor layer on the channel protection layer and the source/drain terminals and patterning the oxide semiconductor layer to form an active layer such that the active layer is in contact engagement with the source/drain terminals through the first vias;

(5) depositing a gate insulation layer on the channel protection layer and the active layer;

(6) depositing a second metal layer on the gate insulation layer and patterning the second metal layer to form a gate terminal and a gate scan line, wherein the gate scan line comprises a scan line terminal formed in a peripheral area of the base plate; and forming a second via in the channel protection layer and the gate insulation layer at a location above and corresponding to the data line terminal; and (7) depositing a second transparent conductive layer on the gate insulation layer, the gate terminal, and the gate scan line and patterning the second transparent conductive layer to form a common electrode, a protective layer set on and covering the gate terminal and the gate scan line, and a conductive connection line set in contact engagement with the data line terminal through the second via;

wherein the first transparent conductive layer and the second transparent conductive layer each have a thickness of 100-1000 Å and the first metal layer and the second metal layer each have a thickness of 1000-6000 Å; and wherein the channel protection layer has a thickness of 1000-4000 Å; the gate insulation layer has a thickness of 2000-4000 Å; and the active layer has a thickness of 200-2000 Å.

12. The TFT substrate manufacturing method as claimed in claim 11, wherein the first transparent conductive layer and the second transparent conductive layer are each formed of a material comprising ITO or IZO; and the first metal layer and the second metal layer are each formed of a material comprising Cr, Mo, Al, or Cu.

13. The TFT substrate manufacturing method as claimed in claim 11, wherein the channel protection layer is formed of a material comprising silicon oxide; the gate insulation layer is formed of a material comprising silicon oxide, silicon nitride or a combination thereof; and the active layer is formed of a material comprising ZnO, InZnO, ZnSnO, GaInZnO, or ZrInZnO.

* * * * *